United States Patent
Fujikami et al.

(10) Patent No.: US 7,749,557 B2
(45) Date of Patent: Jul. 6, 2010

(54) METHOD OF MANUFACTURING SUPERCONDUCTING WIRE

(75) Inventors: Jun Fujikami, Osaka (JP); Takeshi Kato, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 958 days.

(21) Appl. No.: 10/569,739

(22) PCT Filed: Feb. 17, 2005

(86) PCT No.: PCT/JP2005/002412

§ 371 (c)(1),
(2), (4) Date: Feb. 28, 2006

(87) PCT Pub. No.: WO2005/124793

PCT Pub. Date: Dec. 29, 2005

(65) Prior Publication Data

US 2008/0194412 A1     Aug. 14, 2008

(30) Foreign Application Priority Data

Jun. 22, 2004     (JP) ............................. 2004-183634

(51) Int. Cl.
*B05D 5/12*     (2006.01)
*H01L 39/24*     (2006.01)

(52) U.S. Cl. .................. 427/62; 505/433; 505/434; 505/470; 505/740

(58) Field of Classification Search ............. 427/62; 505/433, 434, 470, 740
See application file for complete search history.

(56) References Cited

U.S. PATENT DOCUMENTS

| | | | | |
|---|---|---|---|---|
| 3,963,425 A | * | 6/1976 | Sambrook | 428/608 |
| 4,363,675 A | * | 12/1982 | Yoshizaki | 419/3 |
| 5,091,362 A | * | 2/1992 | Ferrando | 505/452 |
| 5,384,307 A | | 1/1995 | Lay | |
| 5,554,448 A | | 9/1996 | Yamada et al. | |
| 5,594,932 A | * | 1/1997 | Duperray et al. | 419/29 |
| 5,639,714 A | | 6/1997 | Hikata et al. | |
| 5,689,875 A | | 11/1997 | Kanithi | |
| 6,276,048 B1 | | 8/2001 | Hikata et al. | |
| 7,155,806 B2 | * | 1/2007 | Rossi | 29/599 |

(Continued)

FOREIGN PATENT DOCUMENTS

DE     199 33 955 A 1     2/2000

(Continued)

OTHER PUBLICATIONS

Supplementary Search Report dated Mar. 23, 2010 from related European patent application No. 05719214.8-2222/1760728.

*Primary Examiner*—Brian K Talbot
(74) *Attorney, Agent, or Firm*—Foley & Lardner LLP

(57) ABSTRACT

A method of manufacturing a superconducting wire includes the step of drawing a wire formed by coating raw material powder for a superconductor with a metal or a wire with a multifilamentary structure, the step of sealing an end portion of a clad wire or a multifilamentary wire after the step of drawing, and the step of first rolling, rolling the multifilamentary wire after the step of sealing. With this method, a superconducting wire having high and uniform performance can be obtained.

11 Claims, 5 Drawing Sheets

U.S. PATENT DOCUMENTS

2003/0027723 A1 2/2003 Kobayashi

FOREIGN PATENT DOCUMENTS

| EP | 0 609 804 B1 | 10/1999 |
| EP | 1113508 A2 | 7/2001 |
| EP | 1528575 A1 | 5/2005 |
| JP | 02056813 A * | 2/1990 |
| JP | 03-138820 A | 6/1991 |
| JP | 04269471 A * | 9/1992 |
| JP | 04-292812 A | 10/1992 |
| JP | 05-114313 A | 5/1993 |
| JP | 05-250938 A | 9/1993 |
| JP | 2004-87488 A | 3/2004 |
| RU | 2 101 792 C1 | 1/1998 |
| RU | 2 105 370 C1 | 2/1998 |
| RU | 2 122 758 C1 | 11/1998 |
| RU | 2 159 474 C1 | 11/2000 |

* cited by examiner

METHOD OF MANUFACTURING SUPERCONDUCTING WIRE

CROSS-REFERENCE TO RELATED PATENT APPLICATIONS

Japanese Priority Application 2004-183634, filed Jun. 6, 2004 including the specification, drawings, claims and abstract, is incorporated herein by reference in its entirety. This application is a U.S. National Stage of Application PCT/JP2005/002412 filed Feb. 17, 2005, incorporated herein by reference in its entirety.

TECHNICAL FIELD

The present invention relates to a method of manufacturing a superconducting wire, and in particular, to a method of manufacturing a superconducting wire capable of obtaining a superconducting wire with high and uniform performance.

BACKGROUND ART

A superconducting wire made of a multifilamentary wire formed by coating an oxide superconductor having for example Bi2223 phase with a metal is conventionally expected to be applied to a superconducting cable and a magnet, since it can be used at a temperature cooled by liquid nitrogen and a relatively high critical current density can be obtained, and it can be prolonged relatively easily.

Such a superconducting wire has been manufactured as will be described below. Firstly, a wire is fabricated to have a form in which raw material powder for a superconductor containing such as Bi2223 phase is coated with a metal. Next, by performing thermal treatment and rolling repeatedly, a superconducting phase is generated as aligned to a superconducting filament part of the wire, and thus a tape-like superconducting wire is obtained. Such a method of manufacturing a superconducting wire is disclosed for example in Japanese Patent No. 2636049 (Japanese Patent Laying-Open No. 03-138820) (Patent Document 1) and Japanese Patent No. 2855869 (Japanese Patent Laying-Open No. 04-292812) (Patent Document 2).

Patent Document 1: Japanese Patent No. 2636049 (Japanese Patent Laying-Open No. 03-138820)
Patent Document 2: Japanese Patent No. 2855869 (Japanese Patent Laying-Open No. 04-292812)

DISCLOSURE OF THE INVENTION

Problems to be Solved by the Invention

Conventionally, an optimum manufacturing condition for each manufacturing step has been sought to improve performance (such as a critical current value) of a superconducting wire. However, even when a superconducting wire is manufactured under the same optimum condition, the obtained superconducting wire has variations in each performance. Further, some of the obtained superconducting wire has poor performance, and thus a high performance superconducting wire cannot be obtained.

Therefore, an object of the present invention is to provide a method of manufacturing a superconducting wire capable of obtaining a superconducting wire with high and uniform performance.

Means to Solve the Problems

A method of manufacturing a superconducting wire in an aspect of the present invention includes the steps of drawing a wire formed by coating raw material powder for a superconductor with a metal, sealing an end portion of the wire after the step of drawing, and rolling the wire after the step of sealing.

After careful examination, inventors of the present invention have found that the obtained superconducting wire has variations in each performance due to reasons which will be described below. In an interval between the step of drawing and the step of rolling, $CO_2$ (carbon dioxide), $H_2O$ (water), $O_2$ (oxygen) and the like in the air intrude into the wire through an end portion of the wire not coated with a metal. This leads to generation of a hetero phase other than the superconducting phase during sintering, or an uneven thickness of the wire. In particular, as for the thickness, there occurs a phenomenon that the wire has a considerably increased thickness at its end portion. The generation of a hetero phase during sintering interferes with the generation of the superconducting phase, and deteriorates superconducting properties such as the critical current value. Further, if the wire has an uneven thickness, pressure is not uniformly applied to the wire when rolling is performed later, and thus the obtained superconducting wire has an uneven thickness. As a result, the performance of the superconducting wire is deteriorated. Conventionally, no treatment has been performed in the interval between the step of drawing and the step of rolling, and thus the obtained superconducting wire has variations in each performance depending on the difference in the condition for holding each piece of the wire between the step of drawing and the step of rolling.

Consequently, by sealing the end portion of the wire in the interval between the step of drawing and the step of rolling, $CO_2$, $H_2O$, and $O_2$ in the air are less likely to intrude into raw material powder through the end portion of the wire. As a result, a hetero phase is less likely to be generated during sintering and the wire has a uniform thickness, and thus a superconducting wire having high and uniform performance can be obtained.

A method of manufacturing a superconducting wire in another aspect of the present invention includes the steps of drawing a wire formed by coating raw material powder for a superconductor with a metal n times (n is an integer satisfying $n \geq 2$), and rolling the wire after the step of drawing the wire n times. The method further includes the step of sealing an end portion of the wire in at least one of an interval between the step of k-th (k is an integer satisfying $n-1 \geq k \geq 1$) drawing in the step of drawing the wire n times and the step of (k+1)-th drawing in the step of drawing the wire n times and an interval between the step of n-th drawing in the step of drawing the wire n times and the step of rolling.

After careful examination, the inventors of the present invention have found that the obtained superconducting wire has variations in each performance due to reasons which will be described below. When the step of drawing the wire n times is performed to manufacture a superconducting wire, $CO_2$ (carbon dioxide), $H_2O$ (water), $O_2$ (oxygen) and the like in the air intrude into the wire through an end portion of the wire not coated with a metal, in each interval between the steps of drawing from the step of first drawing to the step of n-th drawing, and in an interval between the step of the n-th drawing and the step of rolling. This leads to generation of a hetero phase other than the superconducting phase during sintering, or an uneven thickness of the wire. In particular, as for the thickness, there occurs a phenomenon that the wire has a considerably increased thickness at its end portion. The generation of a hetero phase during sintering interferes with the generation of the superconducting phase, and deteriorates superconducting properties such as the critical current value.

Further, if the wire has an uneven thickness, pressure is not uniformly applied to the wire when rolling is performed later, and thus the obtained superconducting wire has an uneven thickness. As a result, the performance of the superconducting wire is deteriorated. Conventionally, no treatment has been performed in each interval between the steps of drawing from the step of the first drawing to the step of the n-th drawing, and in the interval between the step of the n-th drawing and the step of rolling. Accordingly, the obtained superconducting wire has variations in each performance depending on the difference in the condition for holding each piece of the wire in each interval between the steps of drawing from the step of the first drawing to the step of the n-th drawing, and in the interval between the step of the n-th drawing and the step of rolling.

Consequently, by sealing the end portion of the wire in at least one of each interval between the steps of drawing from the step of the first drawing to the step of the n-th drawing and the interval between the step of the n-th drawing and the step of rolling, $CO_2$, $H_2O$, and $O_2$ in the air are less likely to intrude into the raw material powder through the end portion of the wire. As a result, a hetero phase is less likely to be generated during sintering and the wire has a uniform thickness, and thus a superconducting wire having high and uniform performance can be obtained.

Preferably, in the method of manufacturing a superconducting wire of the present invention, the end portion of the wire is sealed with a metal in the step of sealing.

Thereby, $CO_2$, $H_2O$, and $O_2$ in the air are further less likely to intrude into the raw material powder through the end portion of the wire.

Preferably, in the method of manufacturing a superconducting wire of the present invention, the metal used for sealing contains at least one element selected from the group consisting of silver, lead, tin, copper, and aluminum.

Since these materials have high ductility and mechanical strength, they can easily be processed when sealing the end portion of the wire, and they can stably seal the end portion of the wire.

It is to be noted that "sealing" in the present specification refers to treatment for preventing contact between the raw material powder inside the wire and outside air.

Effects of the Invention

According to the method of manufacturing a superconducting wire of the present invention, by sealing the end portion of the wire in the interval between the step of drawing and the step of rolling, $CO_2$, $H_2O$, and $O_2$ in the air are less likely to intrude into the raw material powder through the end portion of the wire. As a result, a hetero phase is less likely to be generated during sintering and the wire has a uniform thickness, and thus a superconducting wire having high and uniform performance can be obtained.

DESCRIPTION OF REFERENCE CHARACTERS

1. superconducting wire (multifilamentary wire), 1a. wire, 1b. clad wire, 1c. multifilamentary wire, 2. superconductor filament, 2a. raw material powder, 3. sheath part, 3a, 3b. pipe, 20a, 20b. sealing member.

Best Modes for Carrying Out the Invention

In the following, an embodiment of the present invention will be described with reference to the drawings.

First Embodiment

Figure 1:
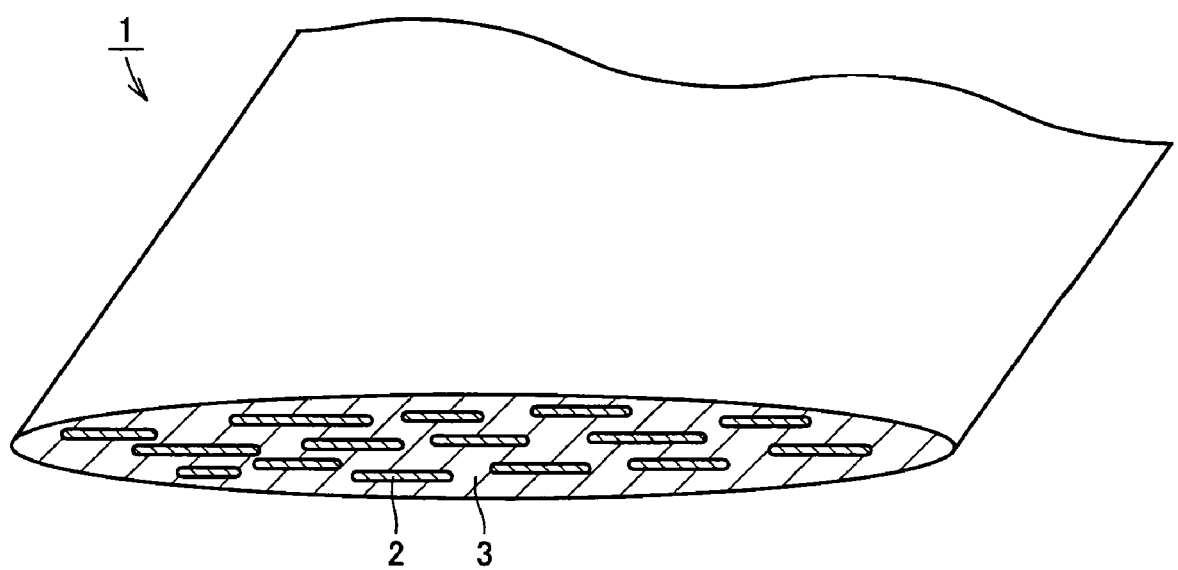
FIG. 1 is a fragmentary sectional perspective view illustrating a structure of a superconducting wire on a conceptual basis.

FIG. 1 is a fragmentary sectional perspective view illustrating a structure of a superconducting wire on a conceptual basis. Referring to FIG. 1, explanation will be given on for example a multifilamentary superconducting wire. A superconducting wire 1 has a plurality of superconductor filaments 2 extending in a longitudinal direction and a sheath part 3 coating them. Each of the plurality of superconductor filaments 2 is made of a material having composition of for example the Bi—Pb—Sr—Ca—Cu—O system, and in particular, the optimum material is a material containing Bi2223 phase in which an atomic ratio of (bismuth and lead):strontium:calcium:copper is approximately represented by 2:2:2:3. Sheath part 3 is made of a material such as silver.

It is to be noted that, although explanation has been given on a multifilamentary wire, an oxide superconducting wire having a monofilamentary structure, in which a single superconductor filament 2 is coated with sheath part 3, may be used.

Next, a method of manufacturing the oxide superconducting wire described above will be explained.

Figure 2:
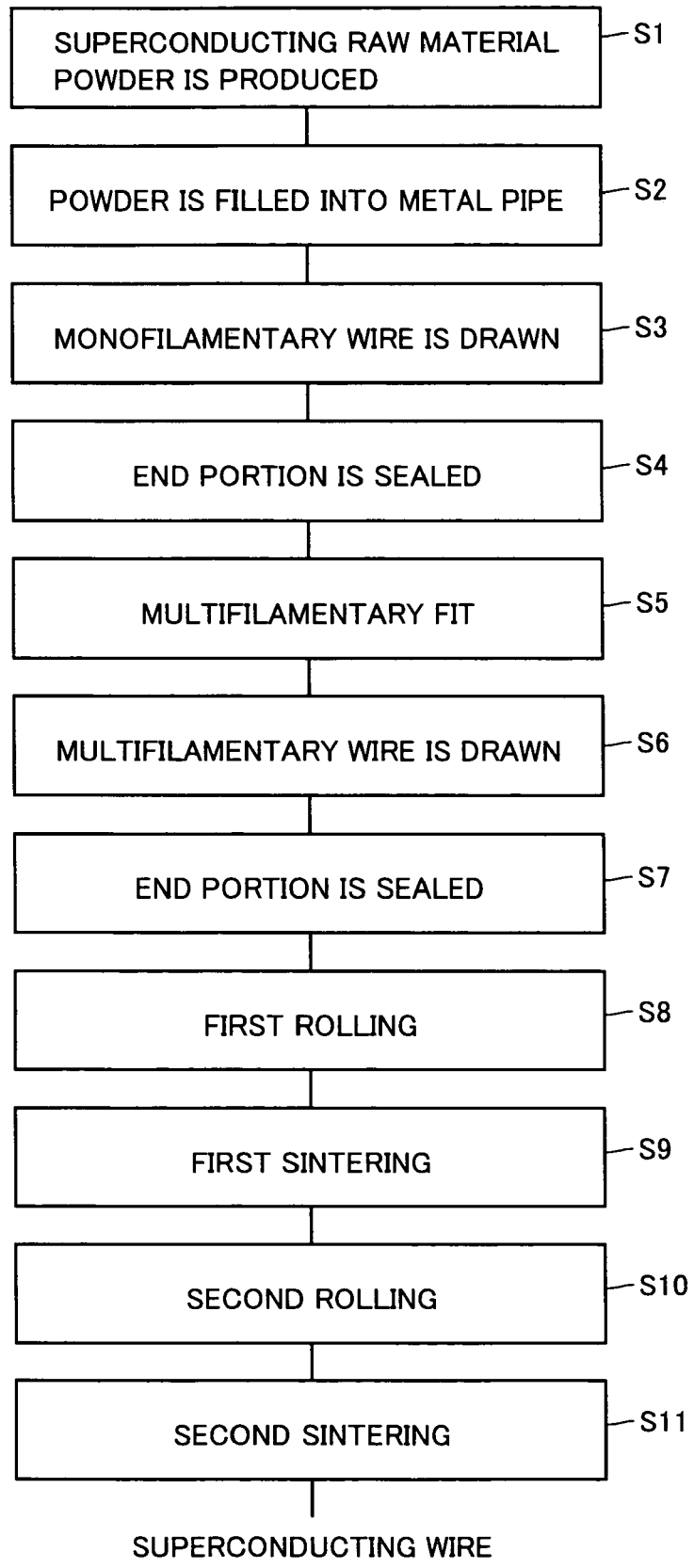
FIG. 2 is a flow chart illustrating a method of manufacturing a superconducting wire in a first embodiment of the present invention.

FIG. 2 is a flow chart illustrating a method of manufacturing a superconducting wire in a first embodiment of the present invention. FIGS. 3 to 8 illustrate respective steps in FIG. 2.

Referring to FIG. 2, the Powder-In-Tube method is used to manufacture a superconducting wire with for example the Bi2223 phase. Firstly, for example five kinds of raw material powder ($Bi_2O_3$, PbO, $SrCO_3$, $CaCO_3$, CuO) are mixed to produce raw material powder in an intermediate state (precursor powder) which will ultimately be changed to a superconductor with the Bi2223 phase by a reaction caused by thermal treatment (Step S1).

Figure 3:
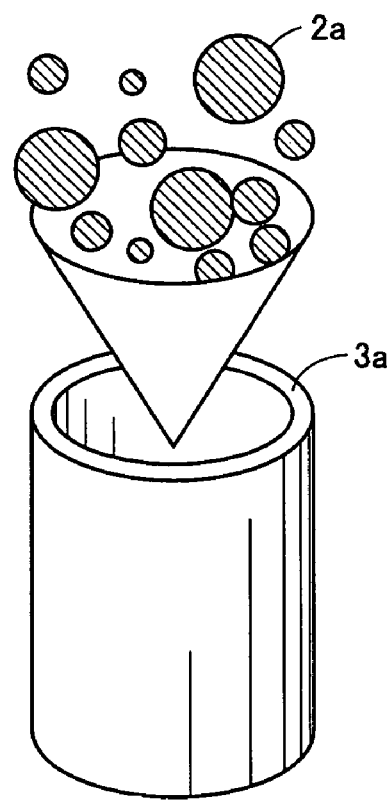
FIG. 3 is a first view illustrating a step in FIG. 2.

Next, as shown in FIGS. 2 and 3, this raw material powder 2a is filled into a pipe 3a (Step S2). Pipe 3a is made of a metal such as silver, having an outer diameter of φ10 to 50 mm and a wall thickness of about 3 to 15% of the outer diameter. Thereby, a wire 1a in which raw material powder 2a for the superconductor is coated with pipe 3a is obtained. Thereafter, degassing of the content of pipe 3a is performed, and both ends of pipe 3a are sealed.

Figure 4:
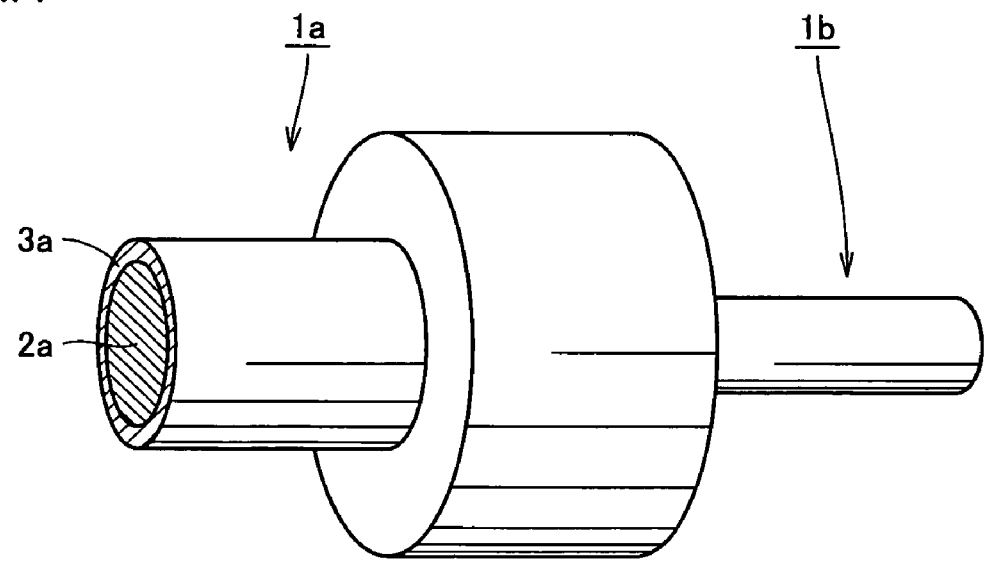
FIG. 4 is a second view illustrating a step in FIG. 2.

Next, as shown in FIGS. 2 and 4, wire 1a is drawn to form a monofilamentary clad wire 1b in which the precursor as a filamentary material is coated with a metal such as silver (Step S3). Clad wire 1b has a shape of a hexagon with a length between opposite sides of such as 2 to 10 mm.

Figure 5:
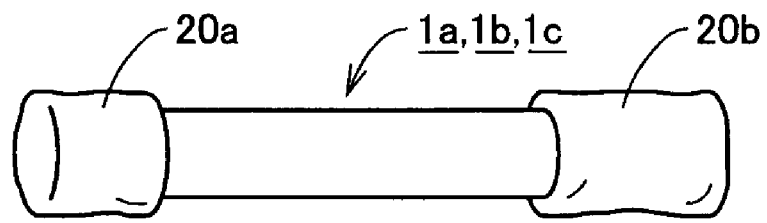
FIG. 5 is a third view illustrating a step in FIG. 2.

Next, as shown in FIGS. 2 and 5, both end portions of clad wire 1b are sealed with sealing members 20a and 20b (Step S4). The sealing of clad wire 1b may be performed for example by putting caps made of Teflon (trademark) over the both end portions of clad wire 1b, or by soldering a metal such as silver to the both end portions of clad wire 1*b*. That is, it is only necessary to cover the both end portions of clad wire 1*b* with some material. A preferable material for sealing clad wire 1*b* is a metal, and in particular, metals such as silver, a silver alloy, lead, tin, copper, and aluminum having ductility and mechanical strength almost similar to those of silver are particularly preferable.

Figure 6:
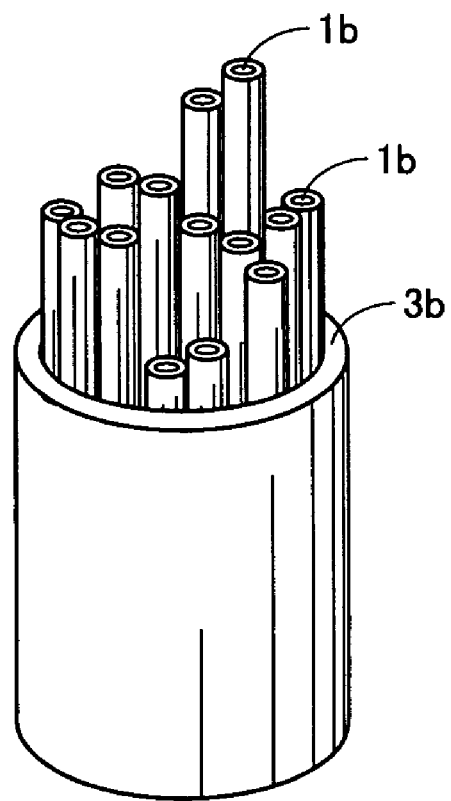
FIG. 6 is a fourth view illustrating a step in FIG. 2.

Next, as shown in FIGS. 2 and 6, a plurality of clad wires lb are bundled to be fit into a pipe 3*b* made of a metal such as silver (multifilamentary fit: Step S5). This pipe 3*b* is made of a metal such as silver or an alloy thereof, having an outer diameter of ϕ10 to 50 mm and a wall thickness of about 3 to 15% of the outer diameter. Thereby, a wire with a multifilamentary structure having a plurality of filaments made of raw material powder 2*a* is obtained.

Figure 7:
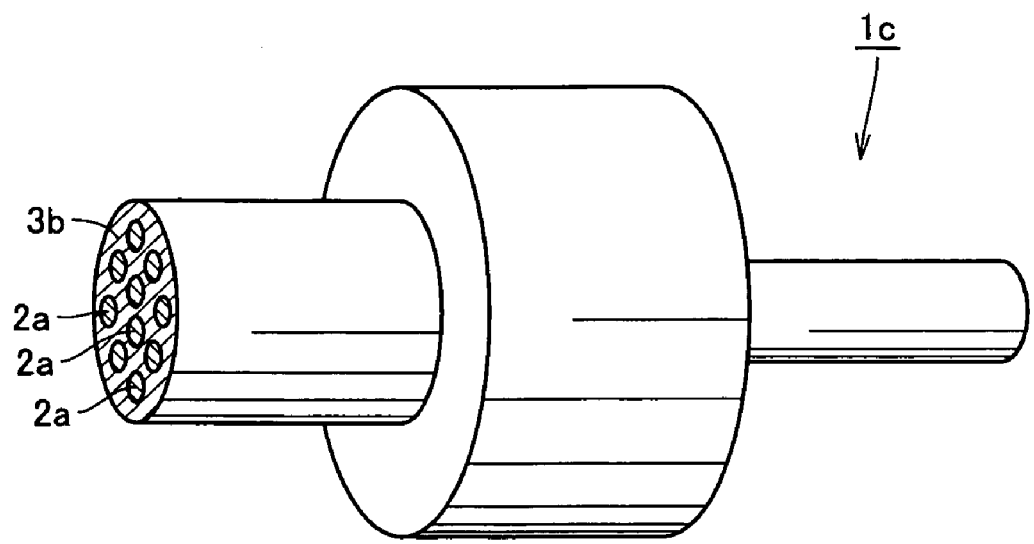
FIG. 7 is a fifth view illustrating a step in FIG. 2.

Next, as shown in FIGS. 2 and 7, the wire with the multifilamentary structure in which a plurality of filaments made of raw material powder 2*a* are coated with sheath part 3*b* is drawn to form a multifilamentary wire 1*c* in which raw material powder 2*a* is embedded within sheath part 3*b* made of such as silver (Step S6).

Next, as shown in FIGS. 2 and 5, both end portions of multifilamentary wire 1*c* are sealed with sealing members 20*a* and 20*b* (Step S7). The sealing of multifilamentary wire 1*c* may be performed for example by putting caps made of Teflon (trademark) over the both end portions of multifilamentary wire 1*c*, or by soldering a metal such as silver to the both end portions of multifilamentary wire 1*c*. That is, it is only necessary to cover the both end portions of multifilamentary wire 1*c* with some material. A preferable material for sealing multifilamentary wire 1*c* is a metal, and in particular, metals such as silver, a silver alloy, lead, tin, copper, and aluminum having ductility and mechanical strength almost similar to those of silver are particularly preferable.

Figure 8:
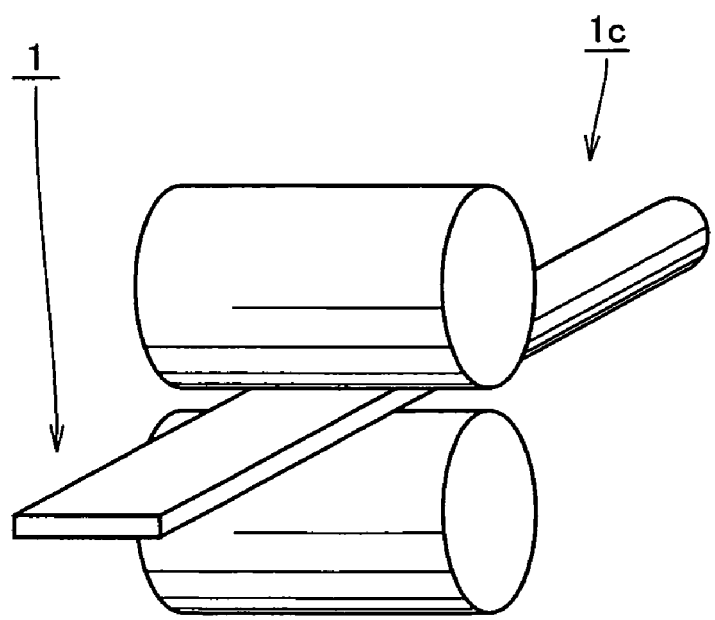
FIG. 8 is a sixth view illustrating a step in FIG. 2.

Next, as shown in FIGS. 2 and 8, first rolling is performed on multifilamentary wire 1*c* to obtain tape-like multifilamentary wire 1 (Step S8). The first rolling is performed at a draft of for example 70 to 90%.

Next, tape-like multifilamentary wire 1 is heated to a temperature of for example 800 to 900° C. and held at that temperature for 10 to 200 hours, and thus multifilamentary wire 1 is subjected to first sintering (Step S9). Thereby, raw material powder 2*a* chemically reacts to become superconductor filament 2.

Next, as shown in FIGS. 2 and 8, multifilamentary wire 1 is subjected to second rolling (Step S10). The second rolling is performed at a draft of for example 0 to 20%.

Next, multifilamentary wire 1 is heated to a temperature of 800 to 900° C. under a pressurized atmosphere and held at that temperature for 10 to 200 hours, and thus multifilamentary wire 1 is subjected to second sintering (Step S11). Although the superconducting wire of the present embodiment is obtained through the steps described above, further rolling and sintering may be performed repeatedly after the second sintering, and the second rolling and the second sintering described above may be omitted.

The method of manufacturing a superconducting wire of the present embodiment includes the step of drawing wire 1*a* formed by coating raw material powder 2*a* for a superconductor with a metal or a wire with a multifilamentary structure (Step S3, Step S6), the step of sealing an end portion of clad wire 1*b* or multifilamentary wire 1*c* after the step of drawing (Step S3, Step S6) (Step S4, Step S7), and the step of the first rolling (Step S8) rolling multifilamentary wire 1*c* after the step of sealing (Step S4, Step S7).

According to the method of manufacturing a superconducting wire of the present embodiment, by sealing the end portion of clad wire 1*b* or multifilamentary wire 1*c* in an interval between the step of drawing (Step S3, Step S6) and the step of the first rolling (Step S8), $CO_2$, $H_2O$ and $O_2$ in the air are less likely to intrude into raw material powder 2*a* through the end portion of clad wire 1*b* or multifilamentary wire 1*c*. As a result, a hetero phase is less likely to be generated during sintering and the wire has a uniform thickness, and thus a superconducting wire having high and uniform performance can be obtained.

In the method of manufacturing a superconducting wire of the present embodiment, the end portion of clad wire 1*b* or multifilamentary wire 1*c* is sealed with a metal in the step of sealing (Step S4, Step S7).

Thereby, $CO_2$, $H_2O$, and $O_2$ in the air are further less likely to intrude into raw material powder 2*a* through the end portion of clad wire 1*b* or multifilamentary wire 1*c*.

In the method of manufacturing a superconducting wire of the present embodiment, the metal used for sealing contains at least one element selected from the group consisting of silver, lead, tin, copper, and aluminum.

Since these materials have high ductility and mechanical strength, they can easily be processed when sealing the end portion of clad wire 1*b* or multifilamentary wire 1*c*, and they can stably seal the end portion of clad wire 1*b* or multifilamentary wire 1*c*.

Although the present embodiment has been described for the case where the step of sealing (Step S4, Step S7) is performed after the formation of clad wire 1*b* (Step S3) and also after the formation of multifilamentary wire 1*c* (Step S6), the present invention is not limited to such a case, and it is sufficient if the step of sealing is performed between the step of drawing and the step of rolling.

Second Embodiment

Referring to FIGS. 2 and 5, the first embodiment has been described for the case where wire la is drawn once in the step of drawing (Step S3). In the drawing process, however, it is common that wire 1*a* is drawn n times (n is an integer satisfying n≧2) consecutively and the diameter of wire 1*a* is gradually decreased to form clad wire 1*b*. In the present embodiment, when wire la is drawn n times, both end portions of wire 1*a* or clad wire 1*b* are sealed with sealing members 20*a* and 20*b* in each interval between the steps of drawing n times or after the formation of clad wire 1*b* (Step S4).

Further, the first embodiment has been described for the case where a wire with a multifilamentary structure is drawn once in the step of drawing (Step S6). In the drawing process, however, it is common that the wire with a multifilamentary structure is drawn n times consecutively and the diameter of the wire with a multifilamentary structure is gradually decreased to form multifilamentary wire 1*c*. In the present embodiment, when the wire with a multifilamentary structure is drawn n times, both end portions of the wire with a multifilamentary structure or multifilamentary wire 1*c* are sealed with sealing members 20*a* and 20*b* in each interval between the steps of drawing n times or after the formation of multifilamentary wire 1*c* (Step S7).

It is to be noted that, except for the points described above, the method of manufacturing the superconducting wire is almost similar to that in the first embodiment shown in FIGS. 1 to 8, and thus the description thereof will not be repeated.

The method of manufacturing a superconducting wire of the present embodiment includes the step of drawing wire 1*a* formed by coating raw material powder 2*a* for a superconductor with a metal or a wire with a multifilamentary structure n times (Step S3, Step S6), and the step of the first rolling (Step S8) rolling multifilamentary wire 1c after the step of drawing n times (Step S3, Step S6). The method further includes the step of sealing an end portion of wire 1a, clad wire 1b, the wire with a multifilamentary structure, or multifilamentary wire 1c in at least one of each interval between the steps of drawing n times (Step S3, Step S6) and an interval between the step of the n-th drawing and the step of the first rolling (Step S8) (Step S4, Step S7).

According to the method of manufacturing a superconducting wire in the present embodiment, by sealing the end portion of wire 1a, clad wire 1b, the wire with a multifilamentary structure, or multifilamentary wire 1c in each interval between the steps of drawing (Step S3, Step S6) and the interval between the step of the n-th drawing and the step of the first rolling (Step S8), $CO_2$, $H_2O$ and $O_2$ in the air are less likely to intrude into raw material powder 2a through the end portion of wire 1a, clad wire 1b, the wire with a multifilamentary structure, or multifilamentary wire 1c. As a result, a hetero phase is less likely to be generated during sintering and the wire has a uniform thickness, and thus a superconducting wire having high and uniform performance can be obtained.

It is to be noted that, although explanation has been given in the first and the second embodiments on the method of manufacturing a bismuth-type multifilamentary oxide superconducting wire having the Bi2223 phase, the present invention is also applicable to a method of manufacturing an oxide superconducting wire having composition other than bismuth-type, such as yttrium-type. In addition, the present invention is also applicable to a method of manufacturing a monofilamentary superconducting wire.

Further, although the first and the second embodiments have been described for the case where the second rolling (Step S10) and the second sintering (Step S11) are performed after the first sintering (Step S9), these steps may be omitted, and a superconducting wire may be completed after the first sintering (Step S9).

EXAMPLE

In the following, an example of the present invention will be described.

In the present example, an effect of sealing both end portions of multifilamentary wire 1c in the interval between the step of drawing (Step S6) and the step of the first rolling (Step S8) was examined. Specifically, raw material powder 2a having the Bi2223 phase was produced (Step S1), and thereafter raw material powder 2a was filled into pipe 3a (Step S2) to form wire 1a. Next, wire 1a was drawn to form clad wire 1b (Step S3), and a plurality of clad wire 1b were bundled without being sealed at both end portions and fit into pipe 3b (Step S5) to form multifilamentary wire 1c. Next, multifilamentary wire 1c was drawn (Step S6). In the drawing process, multifilamentary wire 1c was drawn 20 times repeatedly, and its diameter was gradually decreased to form multifilamentary wire 1c having a desired diameter. In the present example, when multifilamentary wire 1c was drawn, samples 1 to 3 were subjected to different treatments. Specifically, as for sample 1, both end portions of multifilamentary wire 1c were sealed with silver solder (Step S7) after the first drawing in the 20-time drawing. Then, multifilamentary wire 1c was repeatedly drawn for the remaining 19 times with its both end portions sealed, and thereafter held for one month. As for sample 2, multifilamentary wire 1c was drawn 20 times repeatedly, and thereafter its both end portions were sealed with silver solder (Step S7) and it was held for one month. Further, as for sample 3, multifilamentary wire 1c was drawn 20 times repeatedly without its both end portions sealed, and thereafter it was held for one month. Next, the first rolling was performed on multifilamentary wire 1c (Step S8) to obtain tape-like multifilamentary wire 1. Next, the first sintering was performed on multifilamentary wire 1 (Step S9), and thereafter multifilamentary wire 1 was examined on whether there was an increase in thickness. Next, the second rolling was performed on multifilamentary wire 1 (Step S10), and then the second sintering was performed (Step S11) to obtain superconducting wire 1 having a length of 400 m and a silver ratio (a ratio of the area of the sheath part to the area of the superconductor filament part in the cross section of a superconducting wire) of 2.2. Next, the obtained superconducting wire 1 was divided into five pieces to examine a variation in a critical current value (A) of each piece of superconducting wire 1. Table 1 shows the results.

TABLE 1

| Sample No. | Variation in Critical Current Value | Thickness after the First Sintering |
|---|---|---|
| 1 | 8 A | No Change |
| 2 | 10 A | No Change |
| 3 | 30 A | Thickness was increased at both end portions |

As shown in Table 1, as for sample 1 in which sealing was performed after the first drawing, the variation in the critical current value was 8 A, and as for sample 2 in which sealing was performed after the 20th drawing, the variation in the critical current value was 10 A. In contrast, as for sample 3 in which the both end portions were not sealed, the variation in the critical current value was 30 A. Further, although no change was observed in the thickness of samples 1 and 2 after the first sintering (Step S9), the thickness of sample 3 was increased at the both end portions. From the results obtained above, it has been found that sealing the both end portions of multifilamentary wire 1c in the interval between the step of drawing (Step S6) and the step of the first rolling (Step S8) allows the wire to have a uniform thickness, and thus a superconducting wire with high and uniform performance can be obtained. In particular, it has been found that, when a plurality of drawing are performed, a superconducting wire having further uniform performance can be obtained by sealing the wire at a stage as early as possible (at a stage where the wire is thick).

It should be understood that the embodiment and the examples herein disclosed are by way of illustration in all respects and not to be taken by way of limitation. The scope of the present invention is defined not by the above description but by the appended claims, and is intended to include all the modifications within the meaning and the scope equivalent to those of the claims.

The invention claimed is:

1. A method of manufacturing a superconducting wire, comprising:

drawing a wire formed by coating raw material powder for a superconductor with a metal, the wire being one of a monofilamentary wire and a multifilamentary wire, said wire being drawn n times (n is an integer satisfying $n \geq 2$), rolling said wire after said step of drawing said wire n times, and sealing an end portion of said wire in an interval between the step of $k^{th}$ (k is an integer satisfying $n-1 \geq k \geq 1$) drawing in said step of drawing said wire n times and the step of $(k+1)^{th}$ drawing in said step of drawing said wire n times, and maintaining said seal during the drawing.

2. The method of manufacturing a superconducting wire according to claim 1, wherein said end portion of said wire is sealed with a metal in said step of sealing.

3. The method of manufacturing a superconducting wire according to claim 2, wherein said metal contains at least one element selected from the group consisting of silver, lead, tin, copper, and aluminum.

4. The method of manufacturing a superconducting wire according to claim 1, sealing further comprises providing a sealing member configured to encase the end portion of the wire.

5. The method of manufacturing a superconducting wire according to claim 4, wherein the sealing member comprises caps made of Teflon.

6. The method of manufacturing a superconducting wire according to claim 1, wherein the wire is formed in a cylindrical shape having a lengthwise dimension and a base, and wherein sealing an end portion comprises covering the base and at least a portion of the height.

7. The method of manufacturing a superconducting wire according to claim 1, wherein drawing and sealing comprise alternating a drawing step with a sealing step, a plurality of times.

8. The method of manufacturing a superconducting wire according to claim 1, sealing comprises a first sealing step occurring after drawing the wire one of the n times and before drawing the wire another one of the n times.

9. The method of manufacturing a superconducting wire according to claim 8, sealing further comprises a further sealing step occurring after the another one of the n times of drawing and drawing comprises a further drawing of the wire after the further step of sealing.

10. The method of manufacturing a superconducting wire according to claim 1, sealing further comprising sealing the end portion of said wire during each interval between the step of $k^{th}$ (k is an integer satisfying $n-1 \geq k \geq 1$) drawing in said step of drawing said wire n times and the step of $(k+1)^{th}$ drawing in said step of drawing said wire n times.

11. The method of manufacturing a superconducting wire according to claim 1, sealing further comprising sealing the end portions of the multifilamentary wire.

\* \* \* \* \*